United States Patent
Kuo et al.

(10) Patent No.: US 10,416,233 B2
(45) Date of Patent: Sep. 17, 2019

(54) ELECTRONIC APPARATUS AND CONTROL METHOD THEREOF

(71) Applicant: Realtek Semiconductor Corporation, Hsinchu (TW)

(72) Inventors: Chun-Yi Kuo, Taipei (TW); Ying-Yen Chen, Hsinchu (TW); Jih-Nung Lee, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 153 days.

(21) Appl. No.: 15/698,664

(22) Filed: Sep. 8, 2017

(65) Prior Publication Data

US 2018/0210029 A1    Jul. 26, 2018

(30) Foreign Application Priority Data

Jan. 24, 2017    (TW) .............................. 106102668 A

(51) Int. Cl.
*G01R 31/28* (2006.01)
*G01R 31/3177* (2006.01)
*G06F 11/27* (2006.01)
*G06F 11/24* (2006.01)

(52) U.S. Cl.
CPC ..... *G01R 31/3177* (2013.01); *G01R 31/2856* (2013.01); *G06F 11/24* (2013.01); *G06F 11/27* (2013.01)

(58) Field of Classification Search
CPC .. G06F 11/27; G06F 13/1673; G06F 13/1636; G06F 3/0631; G06F 1/206; G06F 1/3275; G06F 12/023; G06F 12/122; G06F 13/24; G06F 3/0604; G06F 3/0673; G06F 12/0223; G06F 13/1668; G06F 13/4282; G06F 2212/1016; G06F 1/26; G01R 31/2856; G01R 31/3177; G11C 11/40626; G11C 7/1072; G11C 7/1018; G11C 7/04; G11C 5/147; G11C 11/4074; H03K 19/0016; Y02D 10/16; Y02D 10/13; Y02D 10/14; Y02D 10/151
See application file for complete search history.

(56) References Cited

U.S. PATENT DOCUMENTS 8,898,530 B1 * 11/2014 Douskey ............. G11C 29/023
                                                            714/733
2005/0201188 A1 * 9/2005 Donze ..................... G06F 1/206
                                                            365/232

(Continued)

FOREIGN PATENT DOCUMENTS

TW        I356290 B      1/2012
TW        I567543 B      1/2017

*Primary Examiner* — Guerrier Merant
(74) *Attorney, Agent, or Firm* — CKC & Partners Co., LLC

(57) ABSTRACT

An electronic device includes a controller, a user interface and a sensor. The user interface and the sensor are coupled to the controller. The user interface is configured to send a first user command to the controller to control the controller to enter a burst mode. The controller is configured to control the sensor to continuously sense a chip or an environment where the chip is located to generate multiple sensing values, and to generate a sensing data according to the sensing values after the controller receives the first user command to enter the burst mode.

20 Claims, 8 Drawing Sheets

100

(56) References Cited

U.S. PATENT DOCUMENTS

| | | | |
|---|---|---|---|
| 2010/0244942 A1* | 9/2010 | Okano | H03K 19/0016 327/544 |
| 2011/0055671 A1* | 3/2011 | Kim | G06F 11/1028 714/800 |
| 2013/0073240 A1* | 3/2013 | Kameyama | G01K 7/01 702/65 |
| 2014/0281311 A1* | 9/2014 | Walker | G06F 3/0631 711/162 |
| 2015/0237183 A1* | 8/2015 | Novet | H04M 1/72569 455/556.1 |
| 2015/0333758 A1* | 11/2015 | Gomi | G06F 1/206 327/115 |
| 2016/0365138 A1* | 12/2016 | Cho | G11C 11/40626 |
| 2017/0102878 A1* | 4/2017 | Mundt | G06F 3/0604 |
| 2018/0314282 A1* | 11/2018 | Tan | G05F 1/565 |

* cited by examiner

ELECTRONIC APPARATUS AND CONTROL METHOD THEREOF

RELATED APPLICATIONS

This application claims priority to Taiwan Application Serial Number 106102668, filed Jan. 24, 2017, which is herein incorporated by reference.

BACKGROUND

Technical Field

The present disclosure relates to an electronic device and a control method thereof. More particularly, the present disclosure relates to an electronic device for measuring chip status in a burst mode and a control method thereof.

Description of Related Art

In design of system on chip (SOC), an embedded sensor (e.g., including a voltage sensor, a process variation sensor, a speed sensor, a temperature sensor, etc.) is often used to monitor chip status. However, when a user turns on or reads the sensor through a user interface, most of time is consumed in a turning on process or a reading process, and therefore continuous changes of the chip status in a short time is difficult to be measured. Moreover, in some specific application, the user interface is unavailable, and therefore the user interface cannot be used to control the sensor to measure the chip status.

SUMMARY

An aspect of the present disclosure is to provide an electronic device that includes a controller, a user interface and a sensor. The user interface and the sensor are coupled to the controller. The user interface is configured to send a first user command to the controller to control the controller to enter a burst mode. The controller is configured to control the sensor to continuously measure a chip or an environment where the chip is located to generate multiple sensing values after the controller receives the first user command and enters the burst mode, and to generate sensing data according to the sensing values.

Another aspect of the present disclosure is to provide a control method adaptable to an electronic device. The electronic device includes a controller, a user interface and a sensor, and the control method includes steps as follows. By the user interface, a first user command is sent to the controller to control the controller to enter a burst mode. By the controller, the sensor is controlled to continuously measure a chip or an environment where the chip is located to generate multiple sensing values after the controller receives the first user command and enters the burst mode. By the controller, sensing data is generated according to the sensing values.

In sum, a time interval between two neighboring measurements can be effectively reduced, and an effect of continuously monitoring the chip status can be achieved in the present disclosure. Moreover, in a state where the user interfaces are unavailable (e.g., chip executes the scan test or the memory built-in self-test), the controllers that enter the burst mode can be used to control the sensors to continuously monitor the chip status for accurate analysis of chip function in the present disclosure.

DETAILED DESCRIPTION

In the following description and claims, the terms "coupled" and "connected," along with their derivatives, may be used. In particular embodiments, "connected" and "coupled" may be used to indicate that two or more elements are in direct physical or electrical contact with each other, or may also mean that two or more elements may be in indirectly electrical contact with each other. The terms "coupled" and "connected" may still be used to indicate that two or more elements cooperate or interact with each other.

Figure 1:
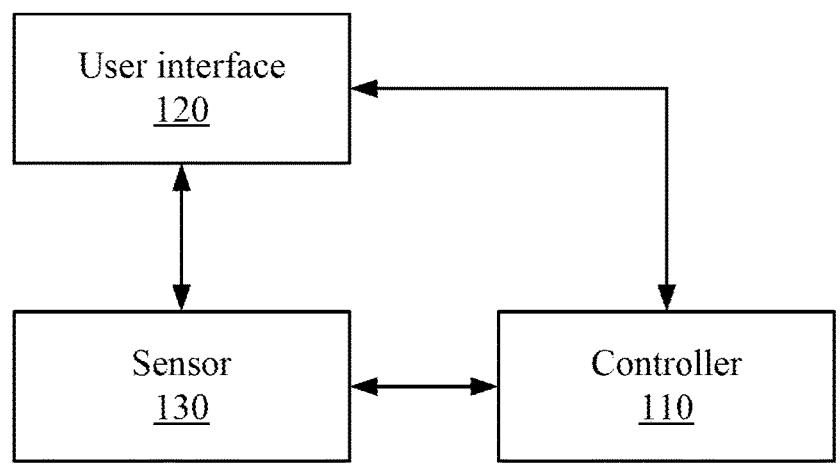
FIG. 1 is a schematic diagram of an electronic device in accordance with an embodiment of the present disclosure.

Reference is made to FIG. 1. FIG. 1 is a schematic diagram of an electronic device 100 in accordance with an embodiment of the present disclosure. The electronic device 100 includes a controller 110, a user interface 120 and a sensor 130. The user interface 120 and the sensor 130 are coupled to the controller 110.

A user may control the controller 110 to enter one of a burst mode and an idle mode through the user interface 120. For example, the user may send a first user command (e.g., an enable signal) to the controller 110 through the user interface 120 to control the controller 110 to enter the burst mode, or send a second user command (e.g., a disable signal) to the controller 110 to control the controller 110 to end the burst mode and enter the idle mode.

After where the controller receives the first user command and enters the burst mode, the controller 110 is further configured to control the sensor 130 to continuously measure a chip or an operating environment of the chip to generate a plurality of sensing values (e.g., voltage, temperature), to receive the sensing values generated by the sensor 130, and to generate a sensing data according to the sensing values. For example, in the burst mode, the controller 110 executes loops of controlling the sensor 130 to measure the chip to generate the sensing values and recording the sensing values until receiving the second user command (e.g., disable signal) sent by the user interface 120, and the controller 110 is further configured to determine a maximum and a minimum in the sensing values to generate the sensing data. Moreover, in another embodiment, the controller 110 is further configured to record time data corresponding to the maximum and time data corresponding to the minimum, to generate the sensing data.

It should be noted that the sensor 130 may not be directly connected to the chip. For example, the sensor 130 may be a voltage sensor, and power lines and/or ground wires of the chip and the voltage sensor are connected together. Alternatively, the sensor 130 may be a clock sensor that is connected to a clock signal terminal of the chip. Alternatively, the sensor 130 may be a temperature sensor that measures an environmental temperature where the chip is located, and therefore the temperature sensor is not directly connected to the chip.

The user may operates the user interface 120 to send the second user command (e.g., a disable signal) to the controller 110 to control the controller 110 to enter the idle mode. After the controller receives the second user command and enters the idle mode, the controller 110 controls the sensor 130 to stop measuring the chip, and the user may operate the user interface 120 to read the sensing data generated by the controller 110.

In practice, the controller 110 may be an integrated circuit or an embedded controller, the user interface 120 may be a host interface or an embedded interface, the sensor 130 may be an embedded sensor in the chip, such as a voltage sensor, a process variation sensor, a speed sensor, temperature sensor. Moreover, the sensor may also be an external environment sensor, for example, an environmental temperature sensor. However, the present disclosure is not limited herein.

Because a time (e.g., about 10-100 μs) for controlling the sensor 130 to measure the chip status by the controller 110 that enters the burst mode is much less than a time (e.g., about 1-100 ms) for controlling the sensor 130 to measure the chip status and reading the corresponding sensing values by the user interface 120, therefore using the controller 110 in the burst mode to control the sensor 130 to measure the chip status can effectively reduce a time interval between every measurement, and the user can monitor differences of the chip status. For example, the sensor 130 is controlled through the user interface 120 by the user, such that it takes 10 ms for the sensor 130 to measure the chip status for 10 times (in a situation where every measurement requires 1 ms). Compared to the above, when the controller 110 is controlled through the user interface 120 by the user to enter the burst mode, the controller 110 can continuously perform 1000 measurements in 10 ms (in a situation where it takes 10 μs for the controller 110 controlling the sensor 130 to measure the chip status). Therefore, differences of the chip status can be effectively monitored by using the embodiment of the present disclosure.

It should be added that, as shown in FIG. 1, the sensor 130 may support multiple control interfaces, that is, the user can directly control the sensor 130 to measure the chip to generate a current sensing value and read the current sensing value through the user interface 120.

Figure 2:
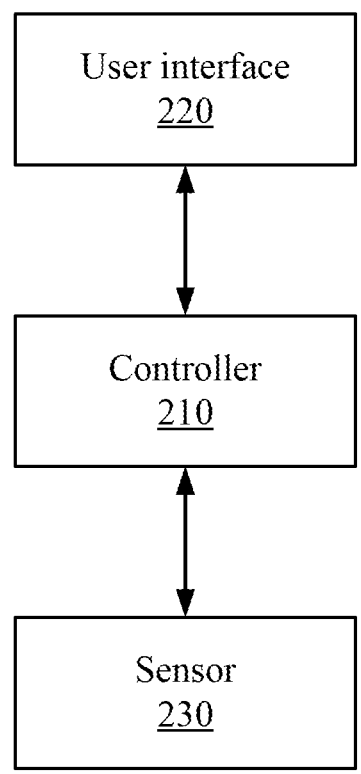
FIG. 2 is a schematic diagram of an electronic device in accordance with an embodiment of the present disclosure.

Alternatively, in another embodiment, the sensor 230 merely supports a single control interface. Reference is made to FIG. 2. FIG. 2 is a schematic diagram of an electronic device 200 in accordance with an embodiment of the present disclosure. The electronic device 200 has similar configuration as configuration of the electronic device 100 except that a controller 210 is coupled to between a user interface 220 and a sensor 230.

In operation, the electronic device 200 is similar to the electronic device 100, and differences are described herein. Because the sensor 230 merely supports a single control interface, the user can operate the user interface 220 to control the controller 210 in the idle mode, in order to control the sensor 230 to measure the chip to generate the current sensing value and read the current sensing value if the user wants to operates the sensor 230 through the user interface 220.

In some embodiments, in the idle mode, the controller 210 in the electronic device 200 has bypass function for the user to directly control the sensor 230 through the user interface 220.

Figure 3:
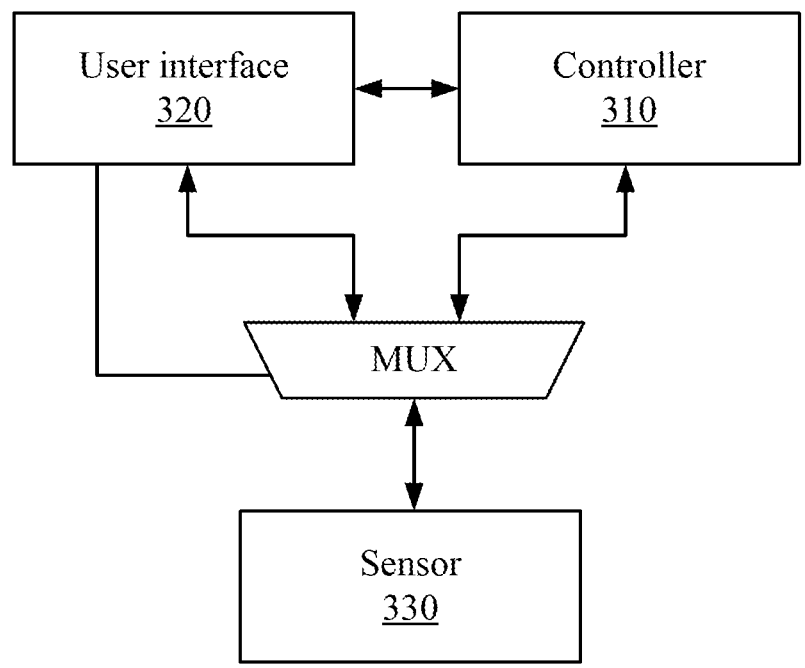
FIG. 3 is a schematic diagram of an electronic device in accordance with an embodiment of the present disclosure.

Alternatively, in another embodiment, the sensor 330 merely supports a single control interface. Reference is made to FIG. 3. FIG. 3 is a schematic diagram of an electronic device 300 in accordance with an embodiment of the present disclosure. The electronic device 300 has similar configuration to the one of the electronic device 100 except that a multiplexer MUX is coupled between a user interface 320 (or a controller 310) and a sensor 330.

In operation, the electronic device 300 is similar to the electronic device 100, and differences are described herein. The user can control the multiplexer MUX to switch the sensor 330 to be coupled to one of the user interface 320 and the controller 310 through the user interface 320. If the user interface 320 controls the multiplexer MUX to cause the controller 310 in the bust mode be coupled to the sensor 330 and controls the controller 310 to enter the burst mode, the controller 310 in the burst mode may control the sensor 330 to continuously measure the chip status. In contrast, if the user interface 320 controls the multiplexer MUX to cause the controller 310 in the burst mode to be coupled to the user interface 320, the user interface 320 may control the sensor 230 to measure the chip to generate a current sensing value and may read the current sensing value. Moreover, as aforementioned, the user may also read the sensing data generated by the controller 310 through the user interface 320.

In some embodiments, the chip is set to execute particular test processes (e.g., scan test, memory built-in self-test (MBIST), etc.). In the particular test processes, the user interface 120 is unavailable. In this condition, the controllers 110, 210 and 310 that enter the burst mode are possible to control the sensors 130, 230 and 330 to continuously measure the chip status under test. As aforementioned, the controllers 110, 210 and 310 may generate the sensing data (e.g., including a maximum, a minimum and time data thereof of the sensing values) according to the sensing values. For example of voltage, the controllers 110, 210 and 310 may generate a maximum voltage, a happening time thereof, a minimum voltage and a happening time thereof of the chip under test for accurate functional analysis of the chip. Regarding the time data, specifically, the controllers 110, 210 and 310 may record loop indices of the maximum (e.g., maximum voltage) and the minimum (e.g., minimum voltage) of the sensing values, and then calculates the happening times corresponding to the maximum and the minimum of the sensing values respectively.

Figure 4:
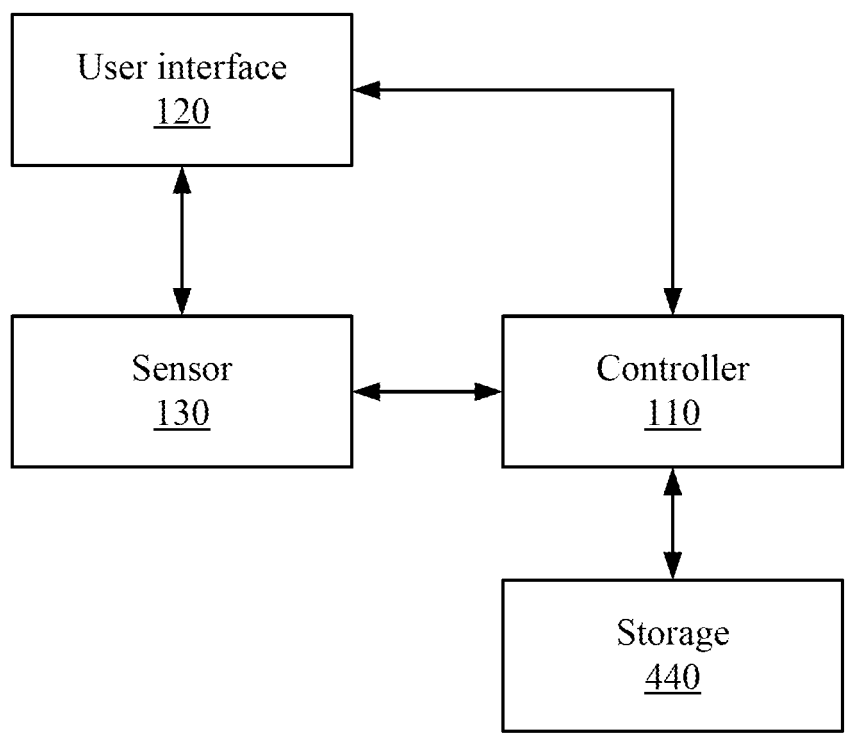
FIG. 4 is a schematic diagram of an electronic device in accordance with an embodiment of the present disclosure.
Figure 5:
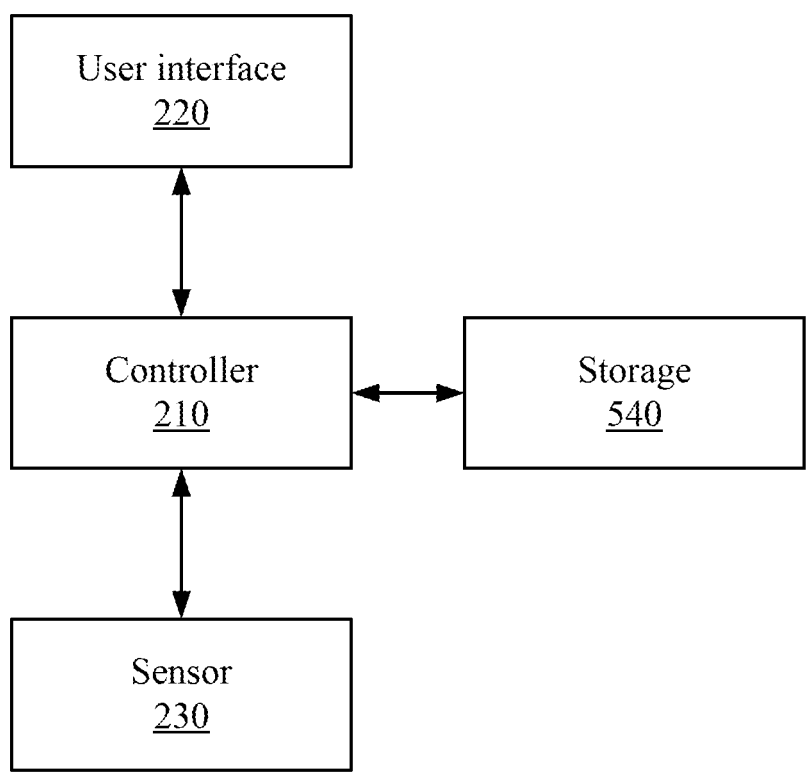
FIG. 5 is a schematic diagram of an electronic device in accordance with an embodiment of the present disclosure.
Figure 6:
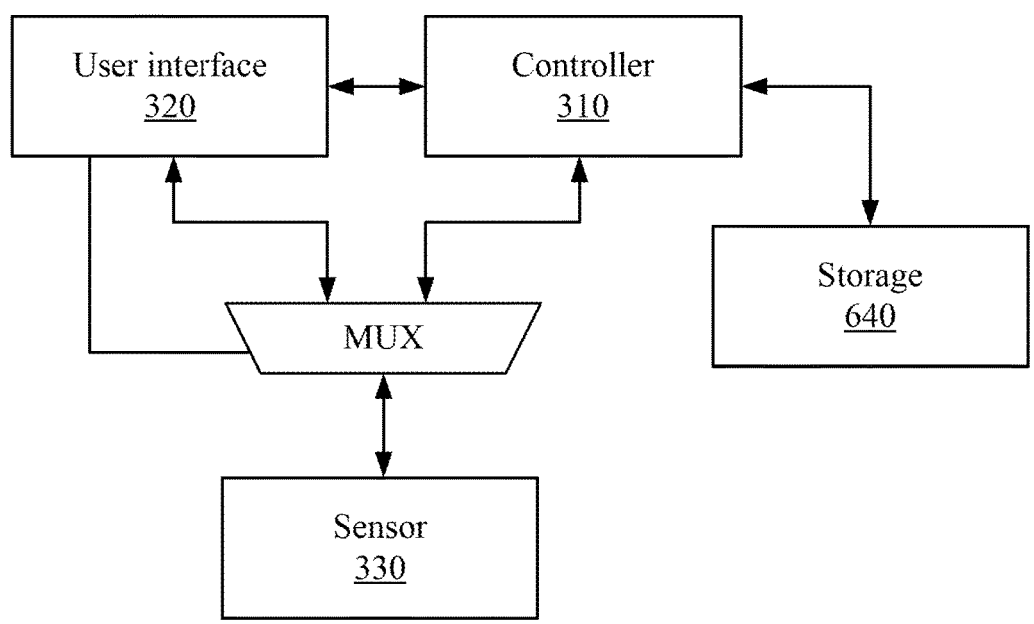
FIG. 6 is a schematic diagram of an electronic device in accordance with an embodiment of the present disclosure.

In some embodiments, the electronic device may include storage. Reference is made to FIGS. 4-6. FIGS. 4-6 are schematic diagrams of electronic devices 400, 500, 600 in accordance with some embodiments of the present disclosure. The electronic devices 400, 500, 600 have similar configurations as configurations of the electronic devices 100, 200, 300 except that storages 440, 540, 640 is coupled to the controllers 110, 210, 310.

In operation, the electronic devices 400, 500, 600 are similar to the electronic devices 100, 200, 300, and differences are described herein. The storages 440, 540 and 640 are configured to store the sensing data generated by the controllers 110, 210 and 310, and the user may operates the user interfaces 120, 220 and 320 to read the sensing data in the storages 440, 540 and 640 through the controllers 110, 210 and 310 in the idle mode. Alternatively, in another embodiment, the user may operate the user interfaces 120, 220 and 320 to directly read the sensing data in the storages 440, 540 and 640.

In practice, the storages 440, 540 and 640 may be registers, static random-access memories (SRAM), memories disposed on the chip or memories disposed separately from the chip.

Figure 7:
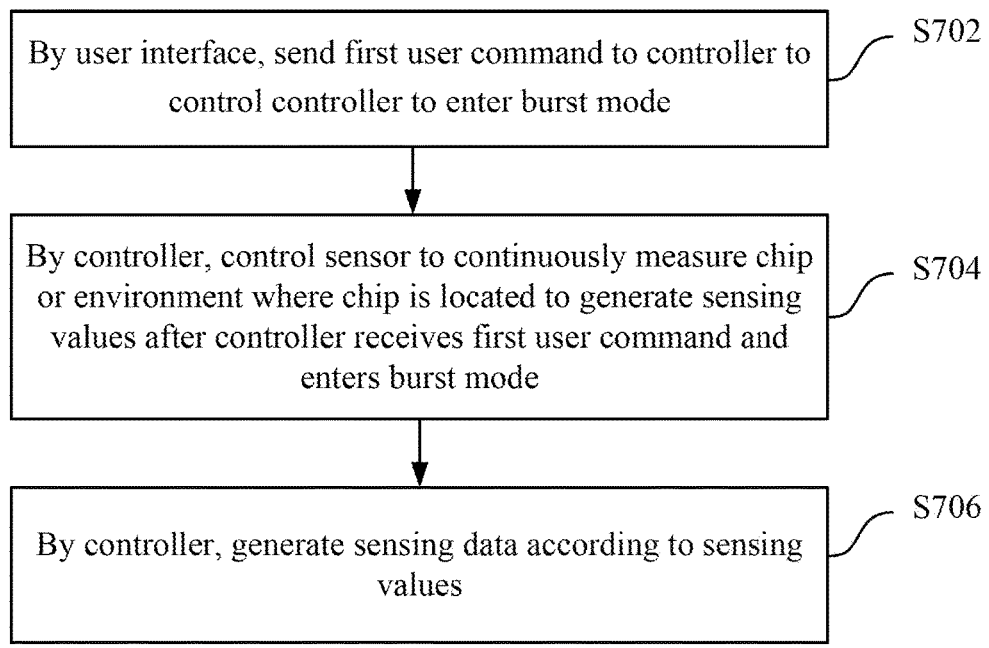
FIG. 7 is a flow chart illustrating a control method in accordance with an embodiment of the present disclosure.
Figure 8:
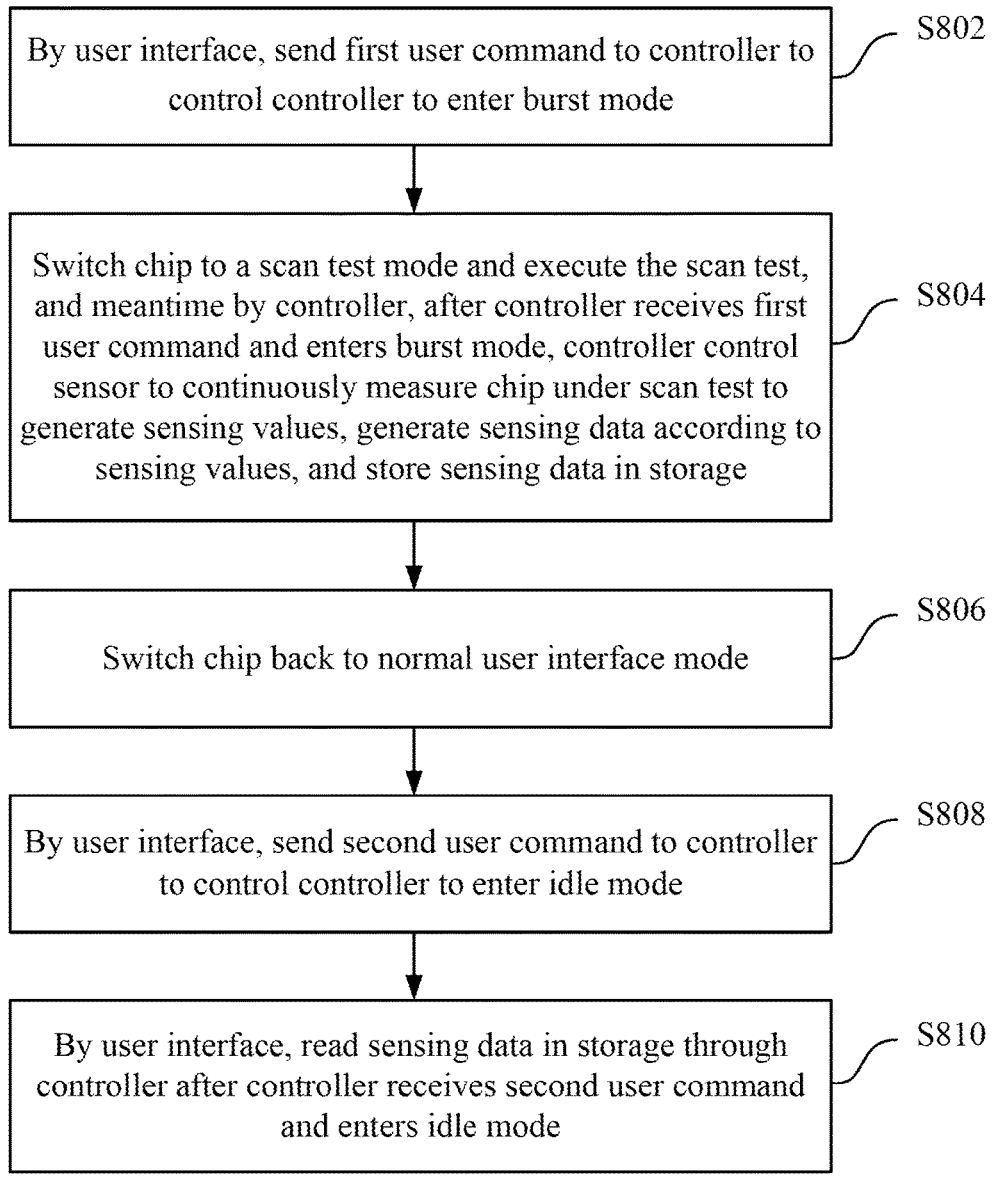
FIG. 8 is a flow chart illustrating a control method in accordance with an embodiment of the present disclosure.

FIGS. 7 and 8 are flow charts illustrating control methods 700 and 800 in accordance with some embodiments of the present disclosure. The control method 700 includes steps S702-S706, the control method 800 includes steps S802-S810, and the control methods 700 and 800 can be applied to the electronic devices 100-600 as shown in FIGS. 1-6. However, those skilled in the art should understand that the mentioned steps in the present embodiment are in an adjustable execution sequence according to the actual demands except for the steps in a specially described sequence, and even the steps or parts of the steps can be executed simultaneously.

In step S702, by the user interfaces 120, 220 and 320, the first user command (e.g., an enable signal) is sent to the controllers 110, 210 and 310 to control the controllers 110, 210 and 310 to enter the burst mode.

In step S704, by the controllers 110, 210 and 310, after the controller receives the first user command and enters the burst mode, the controller controls the sensors 130, 230 and 330 to continuously measure the chip or the environment where the chip is located to generate a plurality of sensing values.

In step S706, by the controllers 110, 210 and 310, the sensing data are generated according to the sensing values.

The control method 800 describes steps of measurement by a chip that executes the scan test.

In step S802, by the user interfaces 120, 220 and 320, the first user command (e.g., an enable signal) is sent to the controllers 110, 210 and 310 to control the controllers 110, 210 and 310 to enter the burst mode.

In step S804, the chip is switched to a scan test mode and executes the scan test, and meantime by the controllers 110, 210 and 310, after the controllers receive the first user command and enter the burst mode, the controllers control the sensors 130, 230 and 330 to continuously measure the chip under the scan test to generate the sensing values, the sensing data are generated according to the sensing values, and the sensing data are stored in the storages 440, 540 and 640. As aforementioned, when the chip executes the scan test, the user interfaces 120, 220 and 320 are unavailable.

In some embodiments, the scan test mode may be another test mode.

In some embodiments, a sensing value obtained by every measurement is stored in corresponding spaces of the storages 440, 540 and 640 respectively.

In step S806, when the scan test is finished, the chip is switched back to a normal user interface mode.

In step S808, by the user interfaces 120, 220 and 320, the second user command (e.g., a disable signal) is sent to the controllers 110, 210 and 310 to control the controllers 110, 210 and 310 to enter the idle mode.

In step S810, by the user interfaces 120, 220 and 320, after the controllers 110, 210 and 310 receive the second user command and enter the idle mode, the sensing data in the storages 440, 540 and 640 are read through the controllers 110, 210 and 310.

In sum, a time interval between two neighboring measurements can be effectively reduced, and an effect of continuously monitoring the chip status can be achieved in the present disclosure. Moreover, in a state where the user interfaces 120, 220 and 320 are unavailable (e.g., chip executes the scan test or the memory built-in self-test), the controllers 110, 210 and 310 that enter the burst mode can be used to control the sensors 130, 230 and 330 to continuously monitor the chip status for accurate analysis of chip function in the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
    a controller;
    a user interface, configured to be operated by a user and coupled to the controller, and configured to send a first user command made by the user to the controller, so as to control the controller to enter a burst mode; and
    a sensor, coupled to the controller, wherein the controller is configured to control the sensor to continuously measure a chip or an environment where the chip is located to generate a plurality of sensing values after the controller receives the first user command and enters the burst mode, and the controller is configured to generate a sensing data according to the sensing values.

2. The electronic device of claim 1, wherein the user interface is further configured to send a second user command to the controller to control the controller to enter an idle mode, and the user interface is further configured to read the sensing data of the controller after the controller receives the second user command and enters the idle mode.

3. The electronic device of claim 1, further comprising:
    a storage coupled to the controller, wherein the controller is further configured to store the sensing data in the storage.

4. The electronic device of claim 2, wherein the controller is further configured to determine a maximum and a minimum in the sensing values to generate the sensing data.

5. The electronic device of claim 4, wherein the controller is further configured to record time data corresponding to the maximum and time data corresponding to the minimum to generate the sensing data.

6. The electronic device of claim 1, further comprising:
    a multiplexer coupled to the user interface, the controller and the sensor, wherein the user interface is further configured to control the multiplexer to switch the sensor to be coupled to one of the user interface and the controller.

7. The electronic device of claim 1, wherein the chip is set to execute a scan test process, and the controller in the burst mode is further configured to control the sensor to continuously measure the chip that executes the scan test process.

8. The electronic device of claim 1, wherein the chip is set to execute a memory built-in self-test (MBIST) process, and the controller in the burst mode is further configured to control the sensor to continuously measure the chip that executes the memory built-in self-test process.

9. The electronic device of claim 1, wherein the user interface is further configured to send a second user command to the controller to control the controller to enter an idle mode, and the controller is further configured to control the sensor to stop measuring the chip after the controller receives the second user command and enters the idle mode.

10. The electronic device of claim 1, wherein the user interface is coupled to the sensor, and the user interface is further configured to control the sensor to measure the chip to generate a current sensing value and read the current sensing value.

11. A control method adaptable to an electronic device, wherein the electronic device comprises a controller, a user interface and a sensor, and the control method comprises:
by the user interface configured to be operated by a user, sending a first user command made by the user to the controller to control the controller to enter a burst mode;
by the controller, controlling the sensor to continuously measure a chip or an environment where the chip is located to generate a plurality of sensing values after the controller receives the first user command and enters the burst mode; and
by the controller, generating a sensing data according to the sensing values.

12. The control method of claim 11, further comprising:
by the user interface, sending a second user command to the controller to control the controller to enter an idle mode; and
by the user interface, reading the sensing data of the controller after the controller receives the second user command and enters the idle mode.

13. The control method of claim 11, wherein the electronic device further comprises a storage, and the control method further comprises:
by the controller, storing the sensing data in the storage.

14. The control method of claim 12, wherein generating the sensing data according to the sensing values comprises:
by the controller, determining a maximum and a minimum in the sensing values to generate the sensing data.

15. The control method of claim 14, wherein determining a maximum and a minimum in the sensing values to generate the sensing data comprises:
by the controller, recording a time data corresponding to the maximum and a time data corresponding the minimum to generate the sensing data.

16. The control method of claim 11, wherein the electronic device further comprises a multiplexer, and the control method further comprises:
by the user interface, controlling the multiplexer to switch the sensor to be coupled to one of the user interface and the controller.

17. The control method of claim 11, wherein the chip is set to execute a scan test process, and controlling the sensor to continuously measure the chip to generate the sensing values comprises:
by the controller, in the burst mode, controlling the sensor to continuously measure the chip that executes the scan test process.

18. The control method of claim 11, wherein the chip is set to execute a memory built-in self-test process, and controlling the sensor to continuously measure the chip to generate the sensing values comprises:
by the controller, in the burst mode, controlling the sensor to continuously measure the chip that executes the memory built-in self-test process.

19. The control method of claim 11, further comprises:
by the user interface, sending a second user command to the controller to control the controller to enter an idle mode; and
by the controller, controlling the sensor to stop measuring the chip after the controller receives the second user command and enters the idle mode.

20. The control method of claim 11, further comprises:
by the user interface, controlling the sensor to measure the chip to generate a current sensing value and reading the current sensing value.

* * * * *